(12) United States Patent
Xia et al.

(10) Patent No.: US 11,984,352 B2
(45) Date of Patent: May 14, 2024

(54) FORMATION METHOD OF SEMICONDUCTOR STRUCTURE

(71) Applicant: CHANGXIN MEMORY TECHNOLOGIES, INC., Hefei (CN)

(72) Inventors: Jun Xia, Hefei (CN); Shijie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 241 days.

(21) Appl. No.: 17/480,326

(22) Filed: Sep. 21, 2021

(65) Prior Publication Data

US 2022/0130720 A1    Apr. 28, 2022

Related U.S. Application Data

(63) Continuation of application No. PCT/CN2021/103799, filed on Jun. 30, 2021.

(30) Foreign Application Priority Data

Oct. 27, 2020    (CN) .......................... 202011165219.9

(51) Int. Cl.
*H01L 21/768*    (2006.01)

(52) U.S. Cl.
CPC .. *H01L 21/76831* (2013.01); *H01L 21/76816* (2013.01); *H01L 21/76877* (2013.01); *H01L 2221/1063* (2013.01)

(58) Field of Classification Search
CPC ......... H01L 21/76831; H01L 21/76816; H01L 21/76877; H01L 2221/1063; H01L 21/76808
See application file for complete search history.

(56) References Cited

U.S. PATENT DOCUMENTS 6,362,093 B1   3/2002 Jang et al.
2005/0003308 A1*  1/2005 Frohlich ........... H01L 21/76834
                                                                430/311

(Continued)

FOREIGN PATENT DOCUMENTS

CN    1835206 A    9/2006
CN    101312150 A  11/2008
CN    103367234 A  10/2013

OTHER PUBLICATIONS

International Search Report as cited in PCT/CN2021/103799 dated Sep. 29, 2021, 9 pages.

*Primary Examiner* — Samuel A Gebremariam
(74) *Attorney, Agent, or Firm* — Cooper Legal Group, LLC

(57) ABSTRACT

Provided is a formation method of a semiconductor structure, including: providing a substrate having a first region and a second region, a plurality of discrete through holes being formed in the substrate, an arrangement density of the through holes in the first region being greater than that in the second region; forming a sacrificial layer filling the through holes; etching some thickness of the substrate around the sacrificial layer to form openings, the openings surrounding the sacrificial layer, a depth of the opening being less than a depth of the through hole in a direction perpendicular to a surface of the substrate; and removing the sacrificial layer, the openings communicating with the corresponding through holes to form trenches.

12 Claims, 4 Drawing Sheets

(56) References Cited

U.S. PATENT DOCUMENTS

2006/0030159 A1* 2/2006 Su .................. H01L 21/76808
438/689
2008/0102638 A1* 5/2008 Naik .................. H01J 37/3266
257/E21.252

* cited by examiner

FORMATION METHOD OF SEMICONDUCTOR STRUCTURE

CROSS-REFERENCE TO RELATED APPLICATIONS

This application is a continuation application of International Patent Application No. PCT/CN2021/103799, filed on Jun. 30, 2021, which claims priority to Chinese Patent Application No. 202011165219.9, filed with the Chinese Patent Office on Oct. 27, 2020 and entitled "FORMATION METHOD OF SEMICONDUCTOR STRUCTURE." International Patent Application No. PCT/CN2021/103799 and Chinese Patent Application No. 202011165219.9 are incorporated herein by reference in their entireties.

TECHNICAL FIELD

The present disclosure relates to the field of semiconductors, and in particular to a formation method of a semiconductor structure.

BACKGROUND

As the feature size of a semiconductor device decreases, spacing between through holes in the semiconductor structure is reduced, and the arrangement density of the through holes in the semiconductor structure is not uniform, resulting in a high density of the through holes in some regions and a low arrangement density of the through holes in other regions.

In a process of filling the through holes, the filling height of the through holes in a high arrangement density is relatively low during the same filling time, resulting in different filling heights of the through holes in the semiconductor structure. In the subsequent etching process to form a Damascene structure, due to the different filling heights of the through holes, etching defects are prone to occur, thereby affecting the yield of the formed semiconductor structure.

SUMMARY

Embodiments of the present application provide a formation method of a semiconductor structure.

An embodiment of the present disclosure provides a formation method of a semiconductor structure, including: providing a substrate having a first region and a second region, a plurality of discrete through holes being formed in the substrate, an arrangement density of the through holes in the first region being greater than that in the second region; forming a sacrificial layer filling the through holes; etching some thickness of the substrate around the sacrificial layer to form openings, the openings surrounding the sacrificial layer, a depth of the opening being less than a depth of the through hole in a direction perpendicular to a surface of the substrate; and removing the sacrificial layer, the openings communicating with the corresponding through holes to form trenches.

BRIEF DESCRIPTION OF DRAWINGS

One or more embodiments are illustrated in an exemplary manner by pictures in the corresponding drawings, and unless otherwise stated, the pictures in the drawings do not constitute a scale limitation.

DESCRIPTION OF EMBODIMENTS

At present, in a process of filling the through holes, the filling height of the through holes in a high arrangement density is relatively low during the same filling time, resulting in different filling heights of the through holes in the semiconductor structure. In the subsequent etching process to form a Damascene structure, due to the different filling heights of the through holes, etching defects are prone to occur, thereby affecting the yield of the formed semiconductor structure.

In order to solve the above technical problem, a first embodiment of the present disclosure provides a formation method of a semiconductor structure, including: providing a substrate having a first region and a second region, a plurality of discrete through holes being formed in the substrate, an arrangement density of the through holes in the first region being greater than that in the second region; forming a sacrificial layer filling the through holes; etching some thickness of the substrate around the sacrificial layer to form openings, the openings surrounding the sacrificial layer, a depth of the opening being less than a depth of the through hole in a direction perpendicular to a surface of the substrate; and removing the sacrificial layer, the openings communicating with the corresponding through holes to form trenches. The embodiment of the present disclosure is provided to avoid etching defects caused by different pattern densities.

In order to make the objectives, technical solutions, and advantages of the embodiments of the present disclosure more clear, various embodiments of the present disclosures will be detailed below in combination with the accompanying drawings. However, a person of ordinary skill in the art can understand that in each embodiment of the present disclosure, many technical details are provided for readers to better understand the present disclosure. However, even if these technical details are not provided and based on variations and modifications of the following embodiments, the technical solutions sought for protection in the present disclosure can also be implemented. The following various embodiments are distinguished for convenience of description, which should not constitute any limitation on the specific implementation manner of the present disclosure. The various embodiments may be combined with each other under the premise of no contradiction.

FIG. 1 to FIG. 8 are schematic cross-sectional structural diagrams corresponding to various steps of a formation method of a semiconductor according to an embodiment of the present disclosure. The semiconductor structure of this embodiment will be described in detail below.

Figure 1:
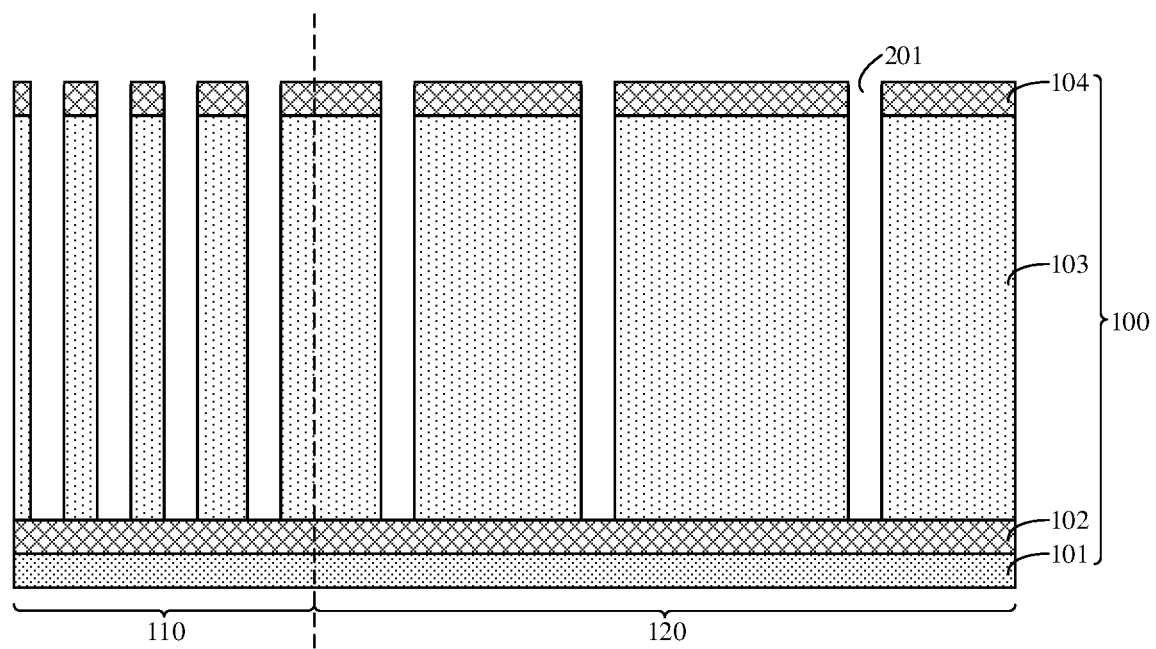
FIG. 1 to FIG. 8 are schematic cross-sectional structural diagrams corresponding to various steps of a formation method of a semiconductor according to an embodiment of the present disclosure.

Referring to FIG. 1, a substrate 100 having a first region 110 and a second region 120 is provided. A plurality of discrete through holes 201 are further formed in the substrate 100, and an arrangement density of the through holes 201 in the first region 110 is greater than that in the second region 120.

In this embodiment, the substrate 100 includes a conductive layer 101, a first insulating layer 102, a dielectric layer 103, and a second insulating layer 104 which are sequentially stacked and formed. It should be noted that this embodiment uses a specific structure of the substrate 100 to describe in detail the formation method of a semiconductor structure according to this embodiment, so that those skilled in the art can understand the implementation of this solution and this embodiment does not constitute a limitation on the present disclosure. In a specific implementation, the formation method of a semiconductor structure in this embodiment can be applied to semiconductors of different structures. Those skilled in the art can select a suitable position according to the structure of the substrate 100 to implement the formation method of a semiconductor structure according to this embodiment.

Specifically, in this embodiment, the conductive layer 101 may be made of a conductive material or of a plurality of conductive materials, such as doped polysilicon, titanium, titanium nitride, tungsten, and tungsten composites; the first insulating layer 102, the dielectric layer 103 and the second insulating layer 104 are made of silicon nitride, silicon dioxide or silicon oxynitride. In this embodiment, the conductive layer 101 is made of copper, the first insulating layer 102 and the second insulating layer 104 are made of silicon nitride, and the dielectric layer 103 is made of silicon oxide.

Since the arrangement density of the through holes 201 in the first region 110 is different from that in the second region 120, when the through holes 201 are filled, a filling height of the through holes 201 in the first region 110 is often lower than that in the second region 120. Due to the different filling heights of the through holes 201, during the process of forming the openings in the first region 110 and the second region 120, it is more likely to over-etch side walls of the through holes 201 in the first region 110, thereby causing an adverse effect on the morphology of the subsequently formed semiconductor structure, and further affecting the yield of the subsequently formed semiconductor structure.

This embodiment is intended to form a sacrificial layer for filling the through holes 201 so that the sacrificial layer located in the first region 110 is flush with the sacrificial layer located in the second region 120. The formation method of the sacrificial layer in this embodiment will be described in detail below in conjunction with the accompanying drawings.

Figure 2:
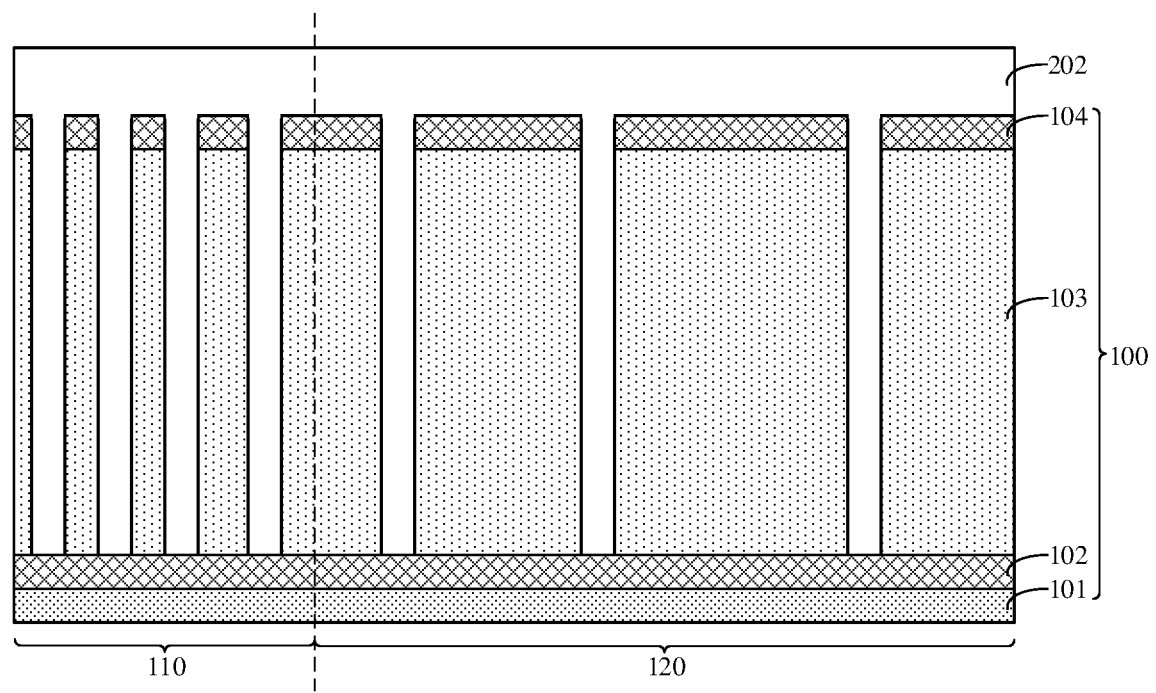
Figure 3:
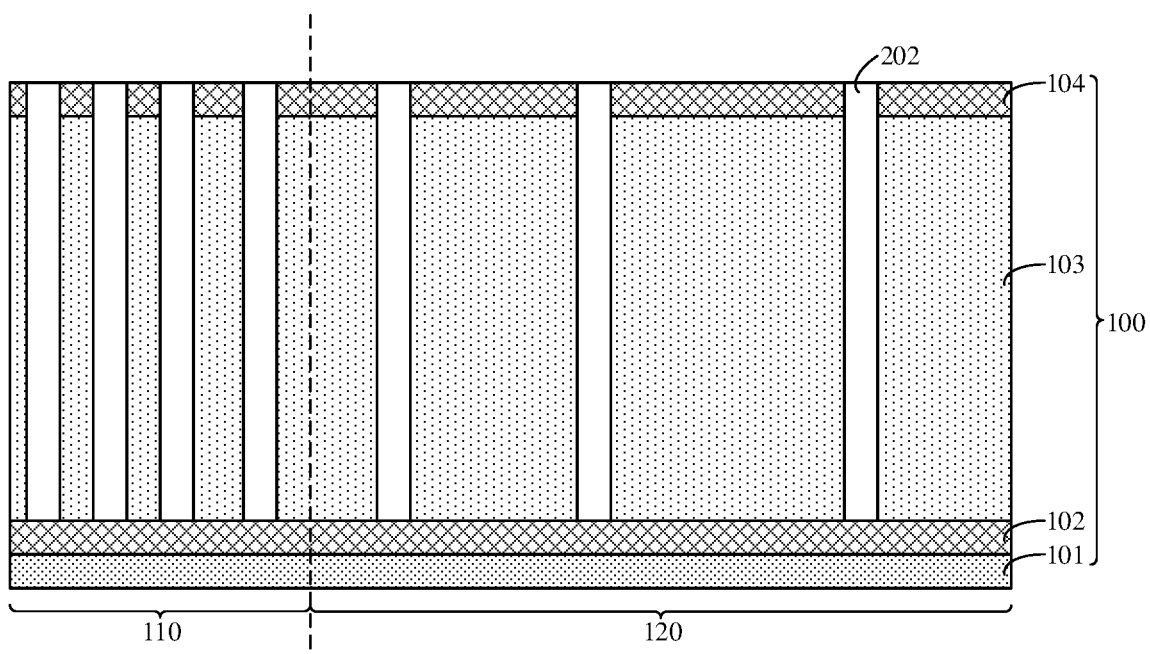

Referring to FIGS. 2 and 3, the sacrificial layer 202 filling the through holes 201 is formed. In a direction perpendicular to the surface of the substrate 100, the sacrificial layer 202 in the first region 110 is flush with the sacrificial layer 202 in the second region 120.

In an example, a material of the formed sacrificial layer 202 includes polysilicon and the formed sacrificial layer 202 may be formed by chemical vapor deposition (CVD) or a furnace tube process.

Specifically, the sacrificial layer 202 is formed by CVD, and the formed sacrificial layer 202 has good density and can fill the through holes 201 more completely. Since the furnace tube process deposits a large number of wafers at the same time, the use of the furnace tube process to form the sacrificial layer 202 can improve the deposition efficiency of the sacrificial layer 202, thereby solving the time cost of semiconductor manufacturing.

In a case where the sacrificial layer 202 is made of polysilicon, since there is a high etch selectivity ratio between the sacrificial layer 202 and the dielectric layer 103, and when the sacrificial layer 202 is subsequently etched, it is avoided that an etching material has a high etching rate to the dielectric layer 103; or when the dielectric layer 103 is subsequently etched, it is avoided that the etching material has a high etching rate to the sacrificial layer 202.

In another example, the sacrificial layer 202 is configured as a hard mask formed by spin coating, and there is a certain etch selectivity ratio between the formed hard mask and the dielectric layer 103, thereby achieving selective etching to the sacrificial layer 202 or the dielectric layer 103.

Compared with the hard mask formed by spin coating as the sacrificial layer 202, the sacrificial layer 202 made of polysilicon has a higher etch selectivity ratio than the hard mask. In the process of subsequent etching to form openings, the sacrificial layer 202 made of polysilicon is less etched, which ensures that the topography of the subsequently formed semiconductor structure is complete, thereby improving the yield of the subsequently formed semiconductor structure.

The forming the sacrificial layer 202 filling the through holes 201 includes the following steps.

A sacrificial film (not shown) filling the through holes 201 and covering the substrate 100 is formed.

Specifically, since the arrangement density of the through holes 201 in the first region 110 is greater than that in the second region 120, in the process of forming the sacrificial film (not shown), due to the difference in the arrangement density, less material is required to fill up the through holes 201 in the second region 120, and more material is required to full fill the through holes 201 in the first region 110; therefore, the formed sacrificial film (not shown) will first fill up the through holes 201 in the second region 120, and as a result, a top surface of the sacrificial film (not shown) that is subsequently formed to cover the substrate 100 is not at the same height, and the top surface of the sacrificial film (not shown) in the second region 120 is higher than the top surface of the sacrificial film (not shown) in the first region 110.

The sacrificial film (not shown) is planarized, and the remaining sacrificial film (not shown) serves as the sacrificial layer 202.

In this embodiment, chemical mechanical polish (CMP) is used for planarization to form the sacrificial layer 202 having the same height in both the first region 110 and the second region 120. In other embodiments, an etching process may be used to planarize the top surface of the sacrificial film (not shown). The top of the sacrificial film (not shown) is polished by way of CMP to form the sacrificial layer 202. Compared with the etching process, the CMP has a higher removal rate, which is beneficial to shortening the process cycle.

Specifically, this embodiment presents two morphologies of the sacrificial layer 202 formed by planarization.

The first morphology: referring to FIG. 2, the sacrificial film (not shown) is planarized until the top surface of the remaining sacrificial film (not shown) is parallel to the top surface of the substrate 100. The formed sacrificial layer 202 fills up the through holes 201, and moreover the sacrificial layer 202 in the first region 110 is flush with the sacrificial layer 202 in the second region 120. That is, the sacrificial layer 202 covering the substrate 100 is located at the same height; for example, the top surface of the sacrificial layer 202 is parallel to the top surface of the substrate 100.

The second morphology: referring to FIG. 3, the sacrificial film (not shown) is planarized until the top surface of the substrate 100 is exposed. The formed sacrificial layer 202 is only used to fill up the through holes 201 located in the first region 110 and the second region 120. That is, the sacrificial layer 202 filling the through holes 201 is flush with the substrate 100.

It should be noted that the provided formation method of a semiconductor structure is described in detail by way of the structure having the sacrificial layer 202 formed in the first morphology in this embodiment, and the formation method of a semiconductor structure applicable to the structure having the sacrificial layer 202 formed in the first morphology likewise is applicable to the structure having the sacrificial layer 202 formed in the second morphology.

Referring to FIGS. 4 to 7, some thickness of the substrate 100 around the sacrificial layer 202 is etched to form openings 301, the openings 301 surround the sacrificial layer 202, and the depth of the opening 301 is less than the depth of the through hole 201 in a direction perpendicular to the surface of the substrate 100.

Figure 4:
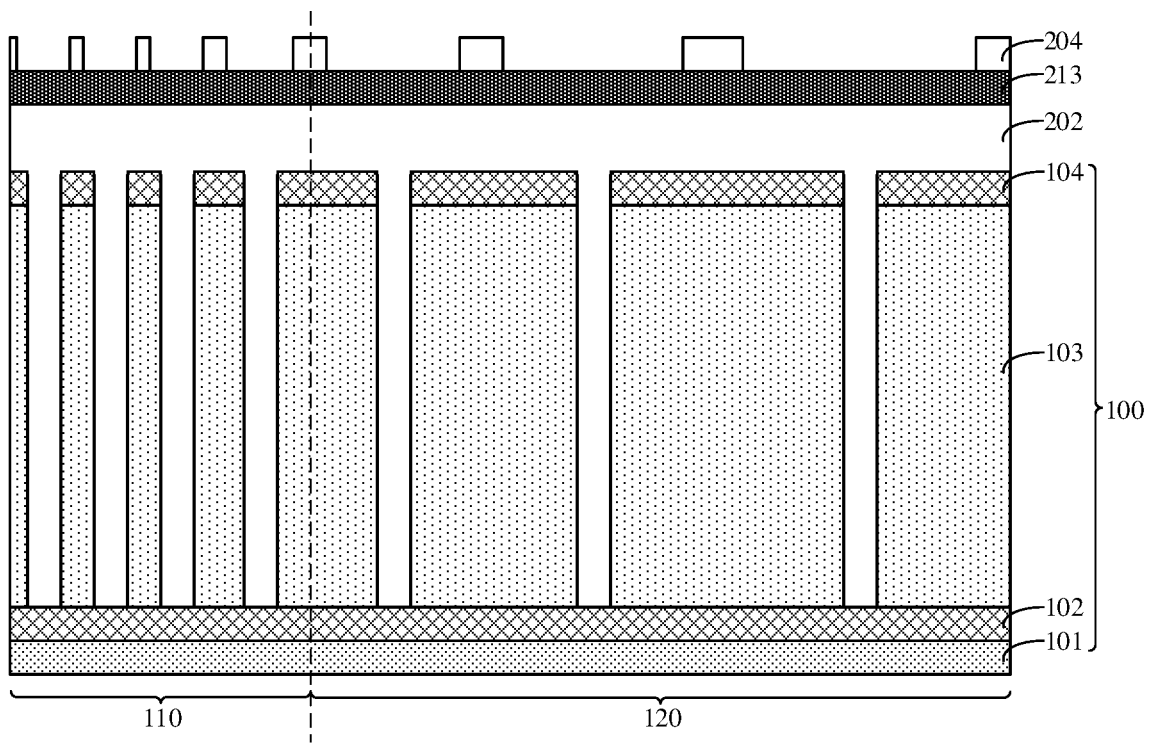
Figure 5:
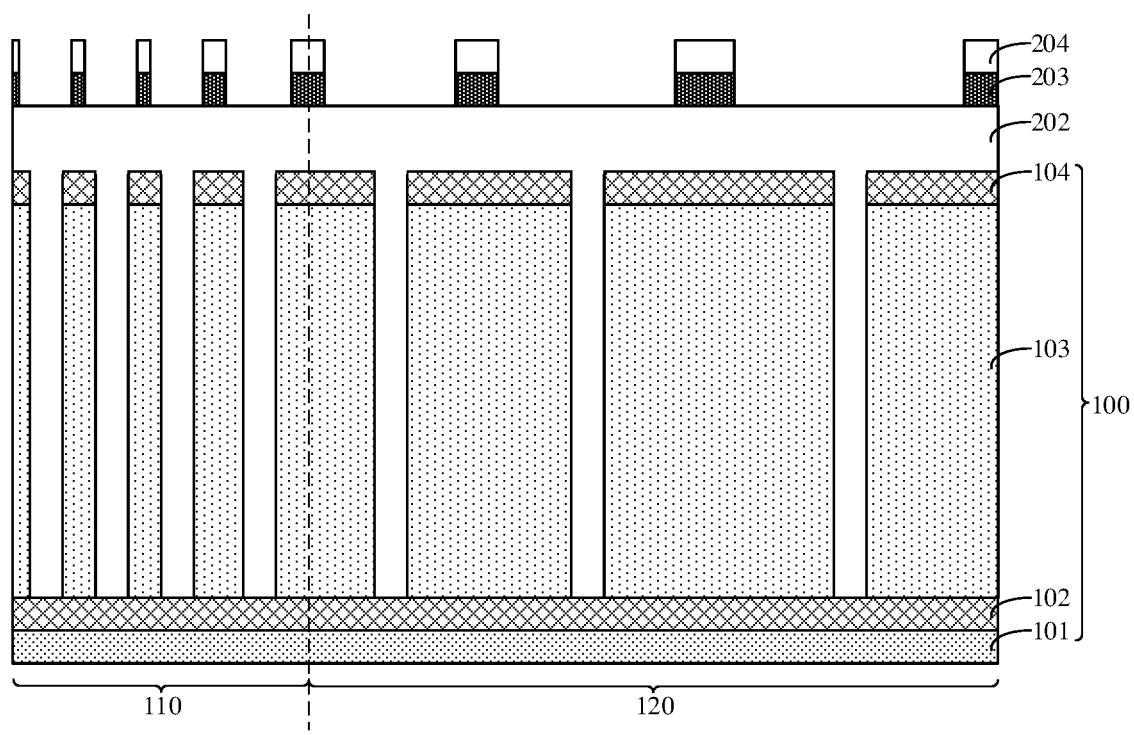

Specifically, referring to FIGS. 4 to 5, a patterned mask layer 203 is formed on the top surface of the substrate 100. In a direction parallel to the surface of the substrate 100, an orthographic projection of a pattern, exposed by the patterned mask layer 203, on the substrate 100 completely covers an orthographic projection of the sacrificial layer 202 on the substrate 100. Since the orthographic projection of the pattern, exposed by the patterned mask layer 203, on the substrate 100 completely covers the orthographic projection of the sacrificial layer 202 on the substrate 100, it can be ensured that the formed opening 301 surrounds the sacrificial layer 202.

The forming the patterned mask layer 203 includes the following steps:

Referring to FIG. 4, a mask layer 213 is formed on the top surface of the sacrificial layer 202, a patterned photoresist 204 is formed on a top surface of the mask layer 213, and an orthographic projection of a pattern, exposed by the patterned photoresist 204, on the substrate 100 completely covers the orthographic projection of the sacrificial layer 202 on the substrate 100.

Referring to FIG. 5, based on the patterned photoresist, part of the mask layer 213 is etched to form the patterned mask layer 203.

Figure 6:
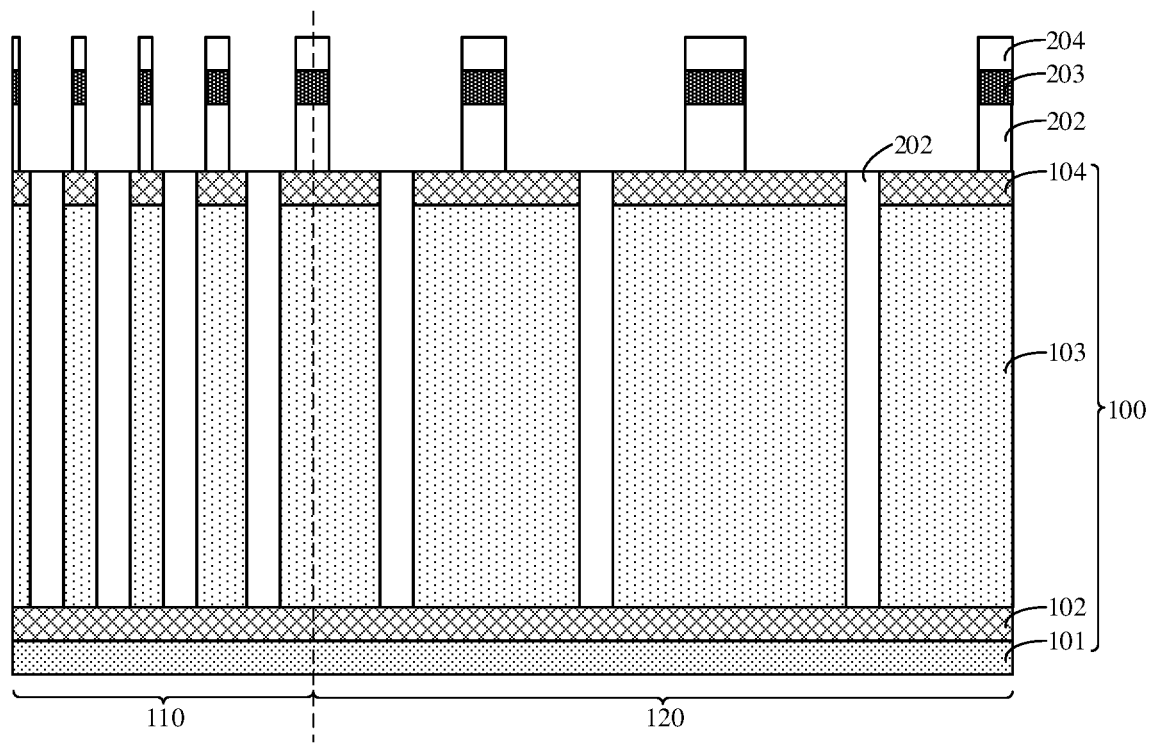

Referring to FIG. 6, based on the patterned mask layer 203, the sacrificial layer 202 on the top surface of the substrate 100 is patterned. Since the present disclosure describes the formation method of a semiconductor structure by an example where the sacrificial layer 202 is formed in the first morphology, the sacrificial layer 202 is also located on the top surface of the substrate 100 in this case. If the sacrificial layer 202 is formed in the second morphology, this step can be omitted.

Figure 7:
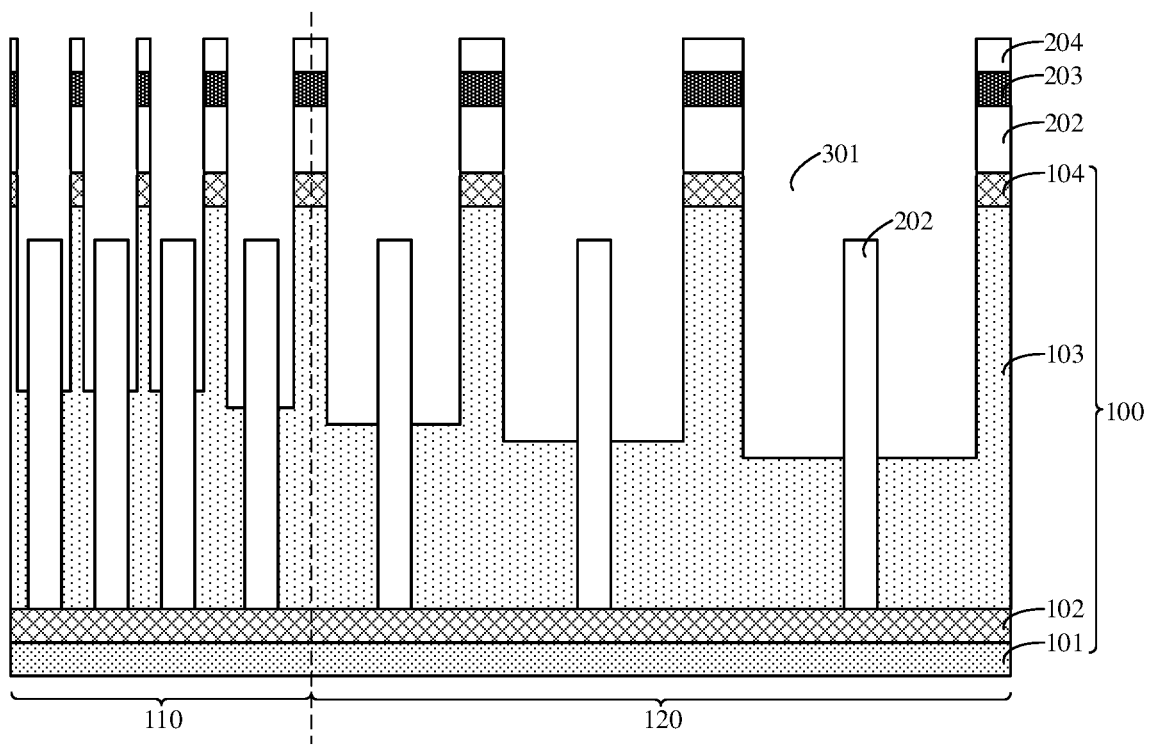

Referring to FIG. 7, based on the patterned mask layer 203, some height of the substrate 100 is etched to form the openings 301.

In the direction parallel to the substrate 100, a width of the opening 301 is based on a width of the pattern exposed by the patterned mask layer 203. Since the arrangement density of the through holes 201 in the first region 110 is greater than that in the second region 120, correspondingly, the width of the opening 301 formed in the first region 110 is less than that in the second region 120. That is, in the direction parallel to the surface of the substrate 100, the width of the opening 301 in the second region 120 is greater than the width of the opening 301 in the first region 110. Moreover, in this embodiment, even if in the same region, the lower the arrangement density of the through holes 201 is, the larger the width of the formed opening 301 is.

It should be noted that the depth of the opening 301 is controlled by the time of etching the substrate 100, and the longer the etching time, the deeper the formed opening 301.

Moreover, the arrangement density of the through holes 201 located in the first region 110 is high, there are more through holes 201 in the substrate 100 of the same size, and the spacing between the through holes 201 is relatively small, so the etching load effect in the first region 110 is relatively large. The arrangement density of the through holes 201 located in the second region 120 is low, there are fewer through holes 201 in the substrate 100 of the same size, and the spacing between the through holes 201 is relatively large, so the etching load effect in the second region 120 is relatively small. That is, due to different etching load effects, in the same etching time, the depths of the openings 301 formed by etching in the first region 110 and the second region 120 are different. The lower the arrangement density of the through holes 201, the smaller the etching load effect, the deeper the correspondingly formed opening 301 around the through hole 201. After the opening 301 is formed, the patterned photoresist 204 and the patterned mask layer 203 are sequentially removed. In this embodiment, the remaining sacrificial layer 202 on the top surface of the substrate 100 also needs to be removed.

In this embodiment, an etching process is carried out to sequentially remove the patterned photoresist 204, the patterned mask layer 203, and the remaining sacrificial layer 202 until the top surface of the substrate 100 is exposed. The etching process is performed to avoid an adverse effect on the yield of the semiconductor structure due to the collapse of the formed semiconductor structure under an excessive impact. In other embodiments, the patterned photoresist, the patterned mask layer, and the remaining sacrificial layer can be removed by CMP. The CMP has a higher removal rate than the etching process, which is beneficial to shortening the process cycle.

Figure 8:
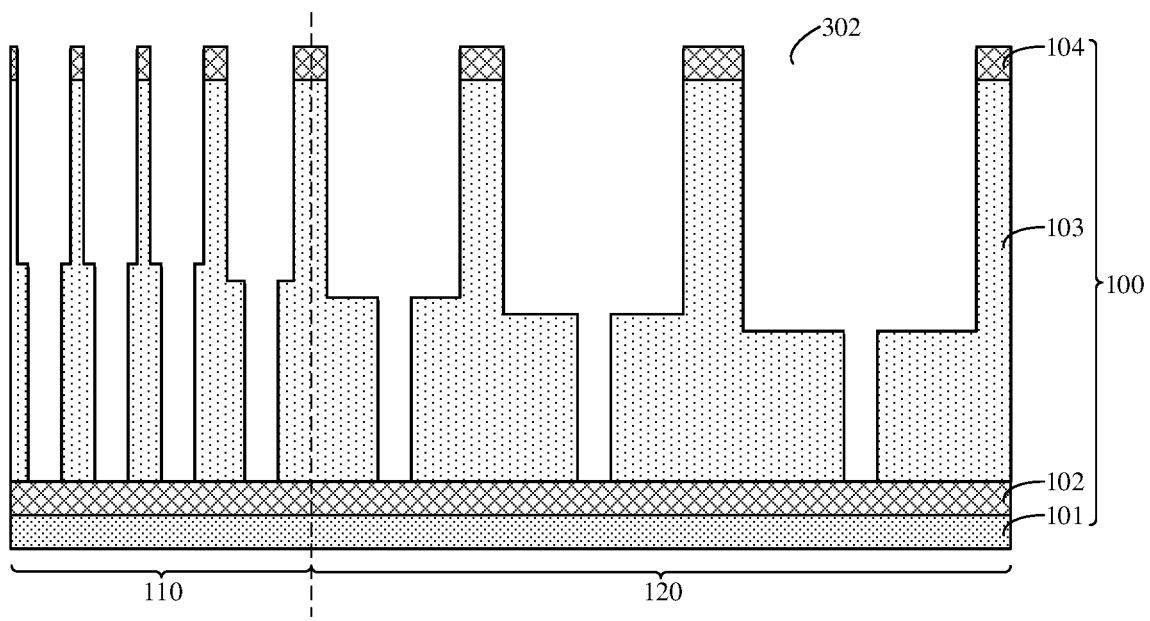

Referring to FIG. 8, the sacrificial layer 202 is removed, and the openings 301 communicate with the corresponding through holes 201 to form trenches 302. The formed trench 302 includes a through hole 201 deeper than the opening 301 and an opening 301 wider than the through hole 201. It can be seen that the formed trench 302 is of a Damascene structure.

In this embodiment, the formed Damascene structure exposes the conductive layer 101 in the substrate 100, and is configured to electrically connect a conductive structure formed in subsequent filling of the Damascene structure with the conductive layer 101.

In this embodiment, the sacrificial layer 202 is removed by using hydrogen plasma.

In this embodiment, the hydrogen plasma used to remove the sacrificial layer 202 only has a chemical reaction effect, but no ion effect. Specifically, hydrogen is ionized by radio frequency in furnace tube equipment to form high-energy molecules and high-energy ions; directional high-energy ions are filtered out through grids provided in the furnace tube equipment, and the remaining hydrogen plasma is used to remove the sacrificial layer 202. The removal of the sacrificial layer 202 by the high-energy molecules can further improve the removal efficiency of the sacrificial layer 202.

Since the material of the sacrificial layer 202 formed in this embodiment includes polysilicon, the hydrogen plasma has a high etching rate for polysilicon, but has an extremely low etching rate for other semiconductor structures. Therefore, in the process of removing the sacrificial layer 202 by hydrogen plasma etching, the etch selectivity ratio is extremely large and usually greater than 1000:1. It can be considered that the hydrogen plasma only reacts with the sacrificial layer 202 and does not react with other structures in the substrate 100.

In addition, since the hydrogen plasma used to remove the sacrificial layer 202 has a weak ion bombardment effect, the opening 301 will not be further etched, so that the depth of the opening 301 will not change significantly during the process of removing the sacrificial layer 202. By preventing the formed semiconductor structure from changing, that is, preventing the formed Damascene structure from being damaged, the yield of the formed semiconductor structure is further improved.

It should be noted that, in other embodiments, if the material of the sacrificial layer is a semiconductor material other than polysilicon, those skilled in the art have reasons to choose a plasma with a high selectivity ratio corresponding to the material of the sacrificial layer to carry out etching. For example, the sacrificial layer can be etched with an etching material having an etch selectivity ratio for the sacrificial layer and the dielectric layer. Due to the high etching selection ratio, during the etching of the sacrificial layer, the depth of the opening will decrease, but the formed semiconductor structure is less affected.

Compared with a related art, the present disclosure ensures that the sacrificial layer filling the through holes has consistent height by forming the sacrificial layer to fill the through holes; in this way, in the subsequent process of forming the Damascene structure based on the sacrificial layer, etching defects due to different pattern densities can be avoided, thereby improving the yield of the semiconductor structure.

The division of the above various steps is only for clear description. In implementation, the steps can be combined into one step or some steps can be split into a plurality steps, as long as they include the same logical relationship, they are all within the protection scope of this patent. Insignificant modifications added to the process or insignificant designs introduced to the process without changing the core design of the process are all within the protection scope of this patent.

A person of ordinary skill in the art can understand that the above-mentioned embodiments are specific embodiments for implementing the present disclosure, and in practical applications, various changes can be made to the embodiments in form and details without departing from the spirit and scope of the present disclosure.

What is claimed is:

1. A formation method of a semiconductor structure, comprising:
    providing a substrate having a first region and a second region, a plurality of discrete through holes being formed in the substrate, an arrangement density of the through holes in the first region being greater than that in the second region;
    forming a sacrificial layer filling the through holes;
    etching some thickness of the substrate around the sacrificial layer to form openings, the openings surrounding the sacrificial layer, a depth of the openings being less than a depth of the through holes in a direction perpendicular to a surface of the substrate; and
    removing the sacrificial layer, the openings communicating with the corresponding through holes to form trenches,
    wherein the lower the arrangement density of the through holes, the deeper the correspondingly formed opening around the through hole.

2. The formation method of a semiconductor structure according to claim 1, wherein in the direction perpendicular to the surface of the substrate, the sacrificial layer in the first region is flush with the sacrificial layer in the second region; the forming the sacrificial layer filling the through holes comprises the following steps:
    forming a sacrificial film filling the through holes and covering the substrate; and
    planarizing the sacrificial film, the remaining sacrificial film serving as the sacrificial layer.

3. The formation method of a semiconductor structure according to claim 2, wherein the sacrificial film is planarized until a top surface of the remaining sacrificial film is parallel to a top surface of the substrate.

4. The formation method of a semiconductor structure according to claim 3, wherein the planarization is carried out by chemical mechanical polish (CMP).

5. The formation method of a semiconductor structure according to claim 2, wherein the sacrificial film is planarized until a top surface of the substrate is exposed.

6. The formation method of a semiconductor structure according to claim 5, wherein the planarization is carried out by chemical mechanical polish (CMP).

7. The formation method of a semiconductor structure according to claim 2, wherein a material of the sacrificial film comprises polysilicon.

8. The formation method of a semiconductor structure according to claim 1, wherein the sacrificial layer is configured as a hard mask formed by spin coating.

9. The formation method of a semiconductor structure according to claim 8, wherein the sacrificial layer is removed by using hydrogen plasma.

10. The formation method of a semiconductor structure according to claim 1, wherein in a direction parallel to the surface of the substrate, a width of the opening in the second region is greater than a width of the opening in the first region.

11. The formation method of a semiconductor structure according to claim 1, wherein the etching some thickness of the substrate around the sacrificial layer to form the openings comprises:
    forming a patterned mask layer on a top surface of the substrate, in a direction parallel to the surface of the substrate, an orthographic projection of a pattern exposed by the patterned mask layer on the substrate completely covering an orthographic projection of the sacrificial layer on the substrate;
    based on the patterned mask layer, etching some height of the substrate to form the openings; and
    removing the patterned mask layer.

12. The formation method of a semiconductor structure according to claim 11, wherein the forming the patterned mask layer on the top surface of the substrate comprises the following steps;
    forming a mask layer on a top surface of the sacrificial layer;
    forming a patterned photoresist on a top surface of the mask layer, an orthographic projection of the pattern, exposed by the patterned photoresist, on the substrate completely covering the orthographic projection of the sacrificial layer on the substrate; and
    based on the patterned photoresist, etching part of the mask layer to form the patterned mask layer.

* * * * *